United States Patent
Zwieback et al.

(10) Patent No.: US 12,060,650 B2
(45) Date of Patent: Aug. 13, 2024

(54) VANADIUM-COMPENSATED 4H AND 6H SINGLE CRYSTALS OF OPTICAL GRADE, AND SILICON CARBIDE CRYSTALS AND METHODS FOR PRODUCING SAME

(71) Applicant: II-VI Delaware, Inc, Wilmington, DE (US)

(72) Inventors: Ilya Zwieback, Twp. of Washington, NJ (US); Varatharajan Rengarajan, Flanders, NJ (US); Andrew E. Souzis, Ramsey, NJ (US); Gary Ruland, Morris Plains, NJ (US)

(73) Assignee: II-VI ADVANCED MATERIALS, LLC, Pine Brook, NJ (US)

( * ) Notice: Subject to any disclaimer, the term of this patent is extended or adjusted under 35 U.S.C. 154(b) by 24 days.

(21) Appl. No.: 17/249,395

(22) Filed: Mar. 1, 2021

(65) Prior Publication Data

US 2021/0269938 A1  Sep. 2, 2021

Related U.S. Application Data

(63) Continuation of application No. 17/029,746, filed on Sep. 23, 2020.
(Continued)

(51) Int. Cl.
*C30B 23/02* (2006.01)
*C01B 32/956* (2017.01)
(Continued)

(52) U.S. Cl.
CPC ............ *C30B 23/02* (2013.01); *C01B 32/956* (2017.08); *C04B 35/573* (2013.01); *C04B 35/65* (2013.01);
(Continued)

(58) Field of Classification Search
None
See application file for complete search history.

(56) References Cited

U.S. PATENT DOCUMENTS 5,856,231 A * 1/1999 Niemann ................ C30B 29/36
257/E21.054
7,608,524 B2  10/2009 Gupta et al.
(Continued)

FOREIGN PATENT DOCUMENTS

| CN | 106894090 A | 6/2017 |
|---|---|---|
| JP | 2001085341 A | 3/2001 |

(Continued)

*Primary Examiner* — Guinever S Gregorio
(74) *Attorney, Agent, or Firm* — Blank Rome LLP (57) ABSTRACT

An optical device includes a vanadium compensated, high resistivity, SiC single crystal of 6H or 4H polytype, for transmitting light having a wavelength in a range of from 420 nm to 4.5 μm. The device may include a window, lens, prism, or waveguide. A system includes a source for generating light having a wavelength in a range of from 420 nm to 4.5 μm, and a device for receiving and transmitting the light, where the device includes a vanadium compensated, high resistivity, SiC single crystal of 6H or 4H polytype. The disclosure also relates to crystals and methods for optical applications, including an aluminum doped SiC crystal having residual nitrogen and boron impurities, where the aluminum concentration is greater than the combined concentrations of nitrogen and boron, and where an optical absorption coefficient is less than about 0.4 $cm^{-1}$ at a wavelength between about 400 nm to about 800 nm.

8 Claims, 8 Drawing Sheets

Related U.S. Application Data (60) Provisional application No. 62/984,177, filed on Mar. 2, 2020.

(51) Int. Cl.
    *C04B 35/573*     (2006.01)
    *C04B 35/65*     (2006.01)
    *C30B 29/36*     (2006.01)
    *G02F 1/00*     (2006.01)
    *H01L 29/36*     (2006.01)

(52) U.S. Cl.
    CPC ...... *C30B 29/36* (2013.01); *C04B 2235/3205* (2013.01); *C04B 2235/3826* (2013.01); *C04B 2235/3839* (2013.01); *C04B 2235/425* (2013.01); *C04B 2235/722* (2013.01); *C04B 2235/76* (2013.01); *C04B 2235/9661* (2013.01); *G02F 1/0063* (2013.01); *H01L 29/36* (2013.01)

(56) References Cited

U.S. PATENT DOCUMENTS

| | | |
|---|---|---|
| 8,040,044 B2 | 10/2011 | Kang et al. |
| 2002/0083890 A1 | 7/2002 | Vodakov et al. |
| 2002/0170490 A1 | 11/2002 | Vodakov et al. |
| 2006/0243984 A1 | 11/2006 | Gupta et al. |
| 2013/0320275 A1 | 12/2013 | Zwieback et al. |
| 2017/0321345 A1 | 11/2017 | Xu et al. |

FOREIGN PATENT DOCUMENTS

| | | |
|---|---|---|
| JP | 2009500861 A | 1/2009 |
| JP | 2016052961 A | 4/2016 |
| WO | 9504171 A1 | 2/1995 |
| WO | 2013177496 A1 | 11/2013 |
| WO | 2016049344 A3 | 3/2016 |
| WO | 2017053883 A1 | 3/2017 |

\* cited by examiner

VANADIUM-COMPENSATED 4H AND 6H SINGLE CRYSTALS OF OPTICAL GRADE, AND SILICON CARBIDE CRYSTALS AND METHODS FOR PRODUCING SAME

CROSS REFERENCE TO RELATED APPLICATION

The present application claims priority to U.S. Provisional Patent Application No. 62/984,177, filed Mar. 2, 2020, and claims the benefit of U.S. patent application Ser. No. 17/029,746, filed Sep. 23, 2020. The present application is a continuation of U.S. patent application Ser. No. 17/029,746. The entire disclosures of U.S. Provisional Patent Application No. 62/984,177 and U.S. patent application Ser. No. 17/029,746 are incorporated herein in their entireties by reference.

BACKGROUND

The present disclosure relates, generally, to optical devices, including, but not necessarily limited to, windows, lenses, prisms, and waveguides, for transmitting optical energy or information. The present disclosure also relates, generally, to systems and methods for using optical devices to transmit optical energy or information.

The present disclosure also relates, generally, to silicon carbide crystals and methods for producing the same. More particularly, but not exclusively, the present disclosure relates to silicon carbide crystals which may be suitable for use in optical applications, and to methods for producing the same.

SUMMARY

The present disclosure relates to vanadium-compensated silicon carbide (SiC) single crystals of 4H and 6H hexagonal polytypes having low optical absorption within their fundamental transparency range, especially, but not necessarily limited to, wavelengths in a range of from about 420 nm to about 4.5 μm. SiC single crystals in accordance with the present disclosure may be used in a variety of optical applications, such as, without limitation, optical windows, lenses, prisms, and waveguides operational in the visible and near-infrared (IR) spectral ranges.

The present disclosure also relates to an optical device including: a vanadium compensated, high resistivity, SiC single crystal of 6H or 4H polytype; where the SiC single crystal is configured for transmission of light having a wavelength in a range of from 420 nm to 4.5 μm. According to one aspect of the present disclosure, the optical device may include a window, lens, prism, or waveguide for transmitting the light having a wavelength in the range of from 420 nm to 4.5 μm.

The present disclosure also relates to an optical transmission system including: a light source for generating light having a wavelength in a range of from 420 nm to 4.5 μm; and an optical device for receiving and transmitting the light, where the optical device includes a vanadium compensated, high resistivity, SiC single crystal of 6H or 4H polytype.

Further, in one embodiment, a composition includes an aluminum doped silicon carbide crystal having residual nitrogen and boron impurities. The silicon carbide crystal includes a concentration of aluminum in the silicon carbide crystal that is greater than a combined concentration of nitrogen and boron in the silicon carbide crystal and the silicon carbide crystal includes an optical absorption coefficient of less than about 0.4 $cm^{-1}$ at a wavelength in a range between about 400 nm to about 800 nm.

In another embodiment, a method for preparing an aluminum doped silicon carbide crystal includes providing a silicon carbide source material and a silicon carbide monocrystalline seed in a growth crucible. The method also includes providing a solid aluminum dopant source material comprising a compound including aluminum and oxygen in a capsule. The growth crucible is heated, with the capsule positioned therein, in a manner effective for producing silicon and carbon bearing vapors from the silicon carbide source material in the growth crucible and aluminum bearing vapors from the solid aluminum dopant source material in the capsule, and for precipitating the silicon and carbon bearing vapors and the aluminum bearing vapors on the silicon carbide monocrystalline seed to grow the aluminum doped silicon carbide crystal. The capsule includes a first material resistant to degradation from the aluminum dopant source and aluminum bearing vapors and a second material resistant to degradation from the silicon and carbon bearing vapors.

BRIEF DESCRIPTION OF THE DRAWINGS

The same reference numbers or other feature designators are used in the figures to designate the same or similar features.

DETAILED DESCRIPTION

Figure 1:
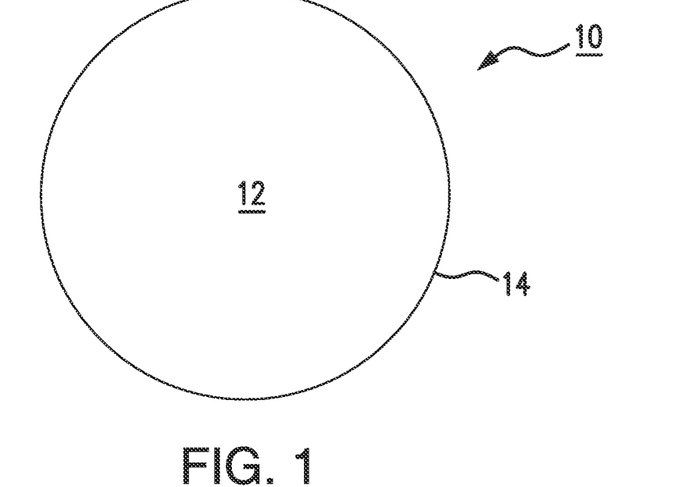
FIG. 1 is a top view of an example of a silicon carbide (SiC) wafer constructed in accordance with the present disclosure.
Figure 2:
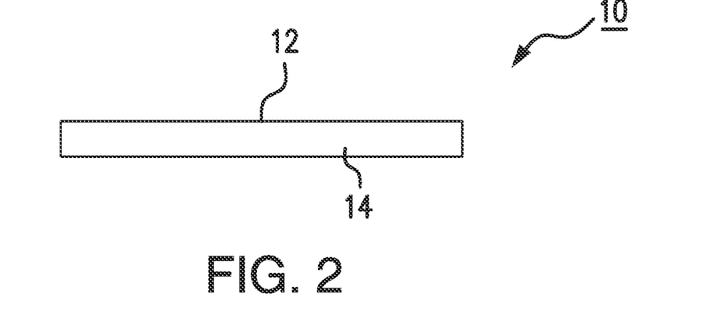
FIG. 2 is a side view of the SiC wafer of FIG. 1.
Figure 3:
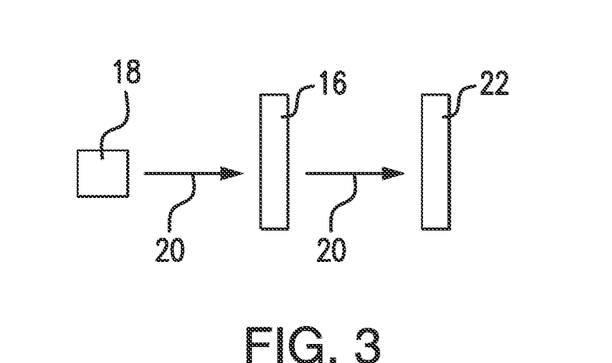
FIG. 3 is a schematic diagram of an example of an optical transmission system constructed in accordance with the present disclosure.

FIGS. 1 and 2 show an example of a silicon carbide (SiC) wafer 10 constructed in accordance with the present disclosure. The wafer 10 may have a face 12 and a cylindrical edge 14. As described in more detail below, the wafer 10 may be a vanadium compensated, high resistivity, SiC single crystal of 4H or 6H hexagonal polytype. FIG. 3 is a diagram of an example of an optical transmission system constructed in accordance with the present disclosure. The transmission system may include a light source 18 for generating light 20, an optical device 16 for receiving and transmitting the light 20, and a destination 22 toward which the light 20 is transmitted by the optical device 16.

The light 20 may have one or more wavelengths in the range of from 420 nm to 4.5 µm. The optical device 16 may be produced from the wafer 10, and may be, for example, a window for transmitting the light 20 while providing a physical barrier between the light source 18 and the destination 22, a lens for focusing or dispersing the light 20, a prism for separating spectral components of the light 20, or a waveguide for guiding the light 20 toward the destination 22.

SiC single crystals are used in certain semiconductor devices, including high power and high frequency diodes and transistors, ultra-fast semiconductor optical switches, and detectors working in harsh environments. Hexagonal SiC crystals may be used as substrates for epitaxial growth of SiC or gallium nitride (GaN) epilayers. Nitrogen-doped n-type 4H—SiC crystals are used as substrates for epitaxial 4H—SiC power switching diodes and transistors, such as MOSFET. See U.S. Pat. No. 8,507,986. High-resistivity (semi-insulating) 4H—SiC and 6H—SiC crystals are used as substrates for epitaxial GaN-based high-frequency transistors, such as HEMT. See U.S. Pat. No. 9,484,284.

Large-size SiC single crystals may be grown from vapor phase by sublimation. See U.S. Pat. No. 5,746,827. In preparation for growth, a SiC source, which may be in the form of SiC powder or grain, may be provided in a high temperature region of a graphite crucible. A SiC seed, such as a monocrystalline SiC plate or wafer, is positioned in a lower temperature region of the crucible, for instance, attached to the crucible lid. The crucible is heated to sublime the SiC source and fill the crucible with the gaseous products of sublimation. The resulting vapors migrate to the cooler SiC seed and deposit on the seed to grow a SiC boule of appropriate dimensions.

In order to meet certain requirements, dopants may be introduced into the growth system to alter the electronic parameters of the grown SiC crystals, such as conductivity type and electrical resistivity. Low-resistivity n-type 4H—SiC single crystals may be produced using nitrogen doping. There are at least two types of compensated high-resistivity SiC single crystals, namely, vanadium-compensated semi-insulating (VCSI) SiC crystals, produced using vanadium doping (see U.S. Pat. No. 5,611,955) and high-purity semi-insulating (HPSI) SiC crystals (see U.S. Pat. No. 7,601,441). The latter may be produced without doping and are compensated by the introduction of deep-level point defects.

Optical and spectroscopic properties of various crystalline SiC forms have been studied in the ultraviolet (UV), visible, and IR ranges. See Singh et al., *Nonlinear Optical Properties of Hexagonal Silicon Carbide*, Appl. Phys. Lett, Vol. 19, 2 (1971) 53-56. The region of fundamental optical transmission of 4H—SiC and 6H—SiC stretches from the band edge cut-off in the visible to $\lambda \approx 4.5$ µm in the infrared, where transparency is terminated by the bands of multi-phonon absorption (see, for example, FIG. 1 of Singh).

Mechanical, chemical, and thermal properties of SiC may be attractive for a variety of optical applications. The desirable properties may include low density, high strength and hardness, high resistance to abrasion, high thermal shock resistance, high thermal conductivity, and chemical stability. Polycrystalline 3C—SiC grown by chemical vapor deposition (CVD) was studied as a potential material for mid-IR windows and domes for operation in harsh environments. See Goela et al., *Transparent SiC for mid-IR windows and domes*, SPIE Vol. 2286 (1994) 46-59.

Hexagonal monocrystalline SiC was explored as a material for optical waveguides. See Luan et al., *Optical ridge waveguides in 4H-SiC single crystal produced by combination of carbon ion irradiation and femtosecond laser ablation*, Optical Materials Express, Vol. 4, No. 6 (2014) 1166-1171; Japanese Patent Document No. 6002106 (Silicon Carbide Optical Waveguide Element); and Chinese Patent Document No. 103472533 (Method for Preparing Er-Doped Silicon Carbide Optical Waveguide Through Ion Implantation).

Optical absorption of sublimation-grown 4H—SiC and 6H—SiC single crystals in the visible (VIS) through IR range has been studied. See Wellmann et al., *Optical Quantitative Determination of Doping Levels and Their Distribution in SiC*, Mat. Sci. Eng. B91-92 (2002) 75-78. These crystals were doped with N, B, and Al in amounts up to $1 \cdot 10^{18}$ cm$^{-3}$ and had poor optical transmission. Optical transmission and reflection of 4H—SiC and 6H—SiC crystals in the infrared have been studied. Cuia et al., *Infrared Transmission and Reflectivity Measurements of 4H- and 6H-SiC Single Crystals*, Mat. Sci. For. Vols. 821-823, pp 265-268 (2015). The samples under study included pure (without deliberate doping), N-doped, B-doped, VCSI, and HPSI. In all these studies, N-doped and B-doped SiC crystals showed significant optical losses that increased with the dopant concentration. Pure SiC crystals showed smaller losses, especially in the visible range. The best IR optical transparency was measured on the semi-insulating VCSI and HPSI samples.

4H—SiC and 6H—SiC belong to the 6 mm space group and are positive uniaxial crystals. Dependencies of the refractive index on wavelength, polarization (ordinary vs extraordinary), and temperature have been studied on semi-insulating 4H—SiC and 6H—SiC single crystals grown by sublimation. See Xu et al., *Temperature Dependence of Refractive Indices for 4H and 6H*, J. Appl. Phys. 115, 113501 (2014) 1-4. For these measurements, prisms with low apex angles were manufactured from the single crystals with the prism edge parallel to the c-axis. The values of refractive index and its dispersions for 4H—SiC and 6H—SiC were found to be practically identical.

While large-size semi-insulating SiC single crystals, both VCSI and HPSI, are commercially available, there have been no known industrial applications of such crystals in transmission optics. This may be due to the residual optical losses in hexagonal SiC which have been neither well understood nor controlled. Various mechanisms that can be responsible for optical absorption within the fundamental transparency range of SiC have been discussed in the literature. They include doping-induced bandgap narrowing, transitions involving dopants, impurities or defects (see, for example, FIG. 1 in Atabaev et al., *Spectral Dependence of Optical Absorption of 4H-SiC Doped with Boron and Aluminum*, J. of Spectroscopy (2018) Article ID 8705658), intra-band transitions, and absorption by free carriers.

The wafer 10 and the optical device 16 shown, by way of example, in FIGS. 1-3 may include a vanadium-compensated SiC single crystal of 6H or 4H polytype having superior optical transmission in a wavelength range of from about 420 nm in the visible to about 4.5 μm in the near-infrared. The SiC single crystal may be used as an optical material for applications in transmission optics, such as, without limitation, optical windows, lenses, prisms, and waveguides.

The SiC crystals described herein may be vanadium-compensated 4H—SiC and 6H—SiC crystals grown by sublimation. During growth, the crystals may be doped (compensated) with vanadium to levels between $9 \cdot 10^{16}$ cm$^{-3}$ and $1.5 \cdot 10^{17}$ cm$^{-3}$, as measured by secondary ion mass spectrometry (SIMS). Concentrations of shallow impurities, such as N, B, and Al, may be controlled not to exceed $3 \cdot 10^{16}$ cm$^{-3}$, as measured by SIMS. Techniques for vanadium doping and shallow impurity control are described in U.S. Pat. Nos. 7,608,524, 8,216,369, 8,361,227, 8,858,709, 9,017,629, and 9,090,989.

The SiC crystal which makes up the wafer 10, or the optical device 16, may be of high structural quality with the absence of dimensional crystal defects, such as inclusions or sub-grains, and a total dislocation density less than $1 \cdot 10^4$ cm$^{-2}$. The overall crystal quality may be evaluated using the technique of x-ray rocking curves. X-ray reflections with FWHM below 25 arc-seconds may be typical indications of high crystal quality.

The wafer 10, formed of 4H—SiC or 6H—SiC single crystal, may be chemical-mechanical polished (CMP), and have a diameter of 150 mm and a thickness of 0.5 mm. The wafer 10 may be oriented "on-axis," that is, with its face 12 perpendicular to the hexagonal c-axis. Slicing, lapping, and polishing of the wafer 10 may be performed according to known fabrication techniques.

Optical transmission and reflection associated with the optical device 16 may be measured in the VIS-IR range using a Cary 7000 Universal Measurement Spectrophotometer (UMS). Mathematical formalism deployed for the calculation of optical parameters according to the present disclosure may be as described below in connection with equations (A1a) through (A7):

4H—SiC and 6H—SiC are hexagonal uniaxial crystals. In such crystals, the optical axis coincides with the crystallographic hexagonal c-axis. When a light beam is incident perpendicularly to the c-face of such a crystal, its polarization is always perpendicular to the optical axis. That is, such a light beam is the ordinary beam and its propagation is governed by the ordinary refractive index $n_o$. Using equation (3) and Table 1 from Xu (cited above) for $n_o$ and substituting T=300K one can obtain expressions for $n_o(\lambda)$ at room temperature:

$$\text{For 4H-SiC:} \quad n_o(\lambda)^2 = 6.5716 + \frac{0.1398}{\lambda^2 - 0.0314} - 0.0219\lambda^2 \tag{A1a}$$

$$\text{For 6H-SiC:} \quad n_o(\lambda)^2 = 6.5748 + \frac{0.1405}{\lambda^2 - 0.0318} - 0.0216\lambda^2 \tag{A1b}$$

For the light beam incident perpendicularly to the c-face of a hexagonal uniaxial crystal, the reflectivity (R) is expressed as:

$$R = \left(\frac{n_o - 1}{n_o + 1}\right)^2 \tag{A2}$$

Optical transmission and reflection for plates with parallel surfaces are calculated by accounting for multiple reflections at the plate front and back interfaces. This approximation yields the following equations for the measured transmission ($T_{mes}$) and reflection ($R_{mes}$). See Pankove J., *Optical Processes in Semiconductors*, Dover Publ. NY 1971, p. 93; F. Soler, *Multiple Reflections in an Approximately Parallel Plate*, Opt. Comm. 139 (1997) 165-169.

$$T_{mes} = \frac{(1-R)^2 e^{-\alpha d}}{1 - R^2 e^{-2\alpha d}} \tag{A3}$$

$$R_{mes} = R + \frac{R(1-R)^2 e^{-2\alpha d}}{1 - R^2 e^{-2\alpha d}} \tag{A4}$$

In equations (A3) and (A4), α is the absorption coefficient in cm$^{-1}$, and d is the plate thickness in cm. If the value of reflectivity R is known, equation (A3) can be resolved with respect to α as follows:

$$e^{-\alpha d} = \frac{(1-R)^2}{2T_{mes}R^2} \cdot \left(\sqrt{1 + \frac{4T_{mes}^2 R^2}{(1-R)^4}} - 1\right) \tag{A5}$$

Transmission and reflection in the extreme case of a fully transparent plate can be obtained from equations (A3) and (A4) by substituting α=0 as follows:

$$T_{max} = \frac{(1-R)^2}{1-R^2}; \tag{A6}$$

$$R_{max} = R + \frac{R(1-R)^2}{1-R^2}; \tag{A7}$$

Coefficients of optical absorption for SiC single crystals were calculated from equation (A5) using the measured transmission ($T_{mes}$) and reflectivity (R). The values of R were calculated using equation (A2) from the refractive index dispersions (A1a) and (A1b) for 4H and 6H determined by Xu.

In addition to optical transmission and reflection, electrical resistivity of SiC single crystals was measured at room temperature using a non-contact instrument COREMA-W having its sensitivity between $1 \cdot 10^5$ and $1 \cdot 10^{12}$ Ωcm. Temperature dependence of resistivity in the temperature range 25-400° C. was measured using a variable-temperature, non-contact resistivity meter COREMA-VT, and the values of activation energy of the electric conductivity ($E_A$) were calculated. Where the wafer resistivity exceeded $1 \cdot 10^{12}$ Ωcm, the room-temperature resistivity was assessed by extrapolation of the resistivity to T=300K using the value of $E_A$. All SiC crystals in this study had their resistivity between $1 \cdot 10^6$ and $1 \cdot 10^{14}$ Ωcm.

Figure 4:
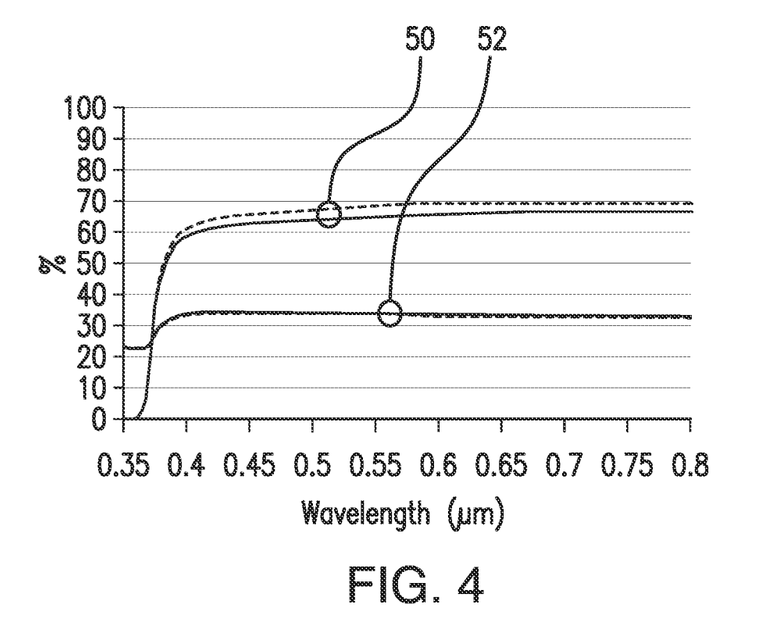
FIG. 4 is a graph of transmission ($T_{mes}$) and reflection ($R_{mes}$) curves ($T_{mes}$, $R_{mes}$ as a function of wavelength) for certain vanadium-compensated 4H—SiC wafers.
Figure 5:
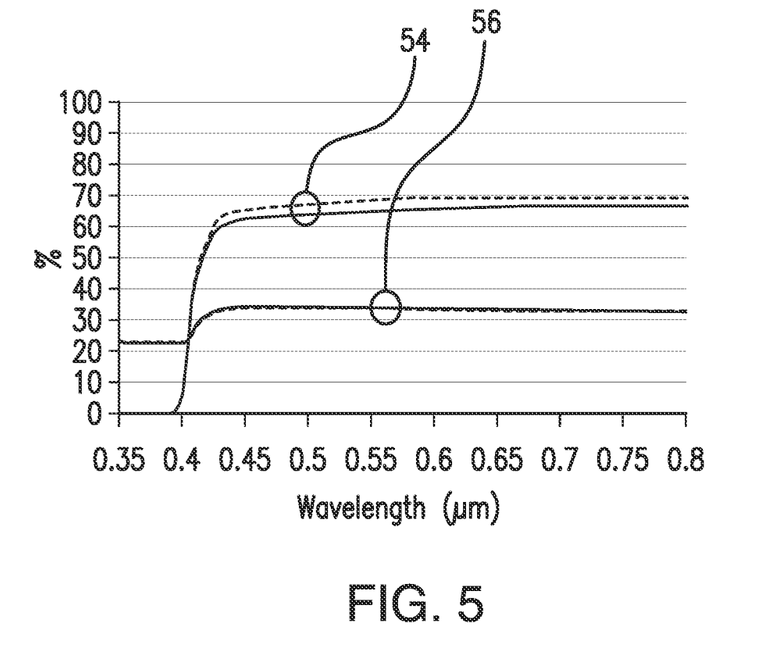
FIG. 5 is a graph of transmission and reflection curves ($T_{mes}$, $R_{mes}$ as a function of wavelength) for certain vanadium-compensated 6H—SiC wafers.

Examples of transmission curves 50 ($T_{mes}$@0° AOI) and reflection curves 52 ($R_{mes}$@6° AOI) measured in the visible range of 0.35 to 0.80 μm on several high-resistivity, vanadium-compensated 4H—SiC wafers are shown in FIG. 4. Examples of transmission curves 54 ($T_{mes}$@0° AOI) and reflection curves 56 ($R_{mes}$@6° AOI) measured in the visible range of 0.35 to 0.80 μm on several high-resistivity, vanadium-compensated 6H—SiC wafers are shown in FIG. 5.

Figure 6:
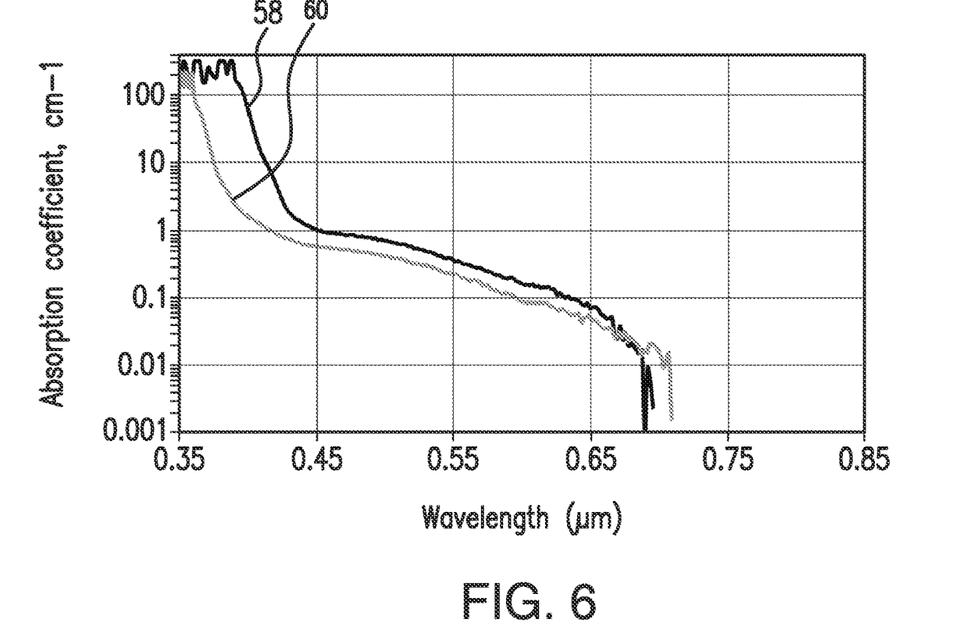
FIG. 6 is a graph which shows optical absorption curves (absorption coefficient as a function of wavelength) for two wafers.

Examples of absorption spectra α(λ) in the visible range for two wafers, one high-resistivity 4H—SiC (line 60) and one high-resistivity 6H—SiC (line 58), calculated using equation (A5), are shown in FIG. 6. These absorption curves 60, 58 show two distinct absorption regions: a steep rise in absorption at wavelengths below approximately 0.40 μm for the 4H crystal and below approximately 0.44 μm for the 6H crystal. This absorption rise is believed to be due to the fundamental cut-off, i.e., transitions from the valence band to the conduction band. Its slope is proportional to $\lambda^{-2}$ due to the indirect nature of the hexagonal SiC bandgap and phonon-assisted electron transitions. See Sridhara et al., *Absorption Coefficient of 4H Silicon Carbide from 3900 to 3250 A*, J. Appl. Phys. Vol. 84, No. 5 (1998) 2963-2964.

As shown in FIG. 6, there is a near band edge absorption "shoulder" between 0.45 and 0.7 μm with its amplitude between about 0.01 cm$^{-1}$ at $\lambda \approx 0.7$ μm and about 1 cm$^{-1}$ at $\lambda \approx 0.45$ μm. This residual absorption is commonly observed in wide bandgap semiconductors and often assigned to electron transitions involving unspecified shallow levels, such as crystal defects or impurities. Optical absorption at wavelengths beyond $\lambda \approx 0.7$ μm is very low, below 0.1 cm$^{-1}$.

Figure 7:
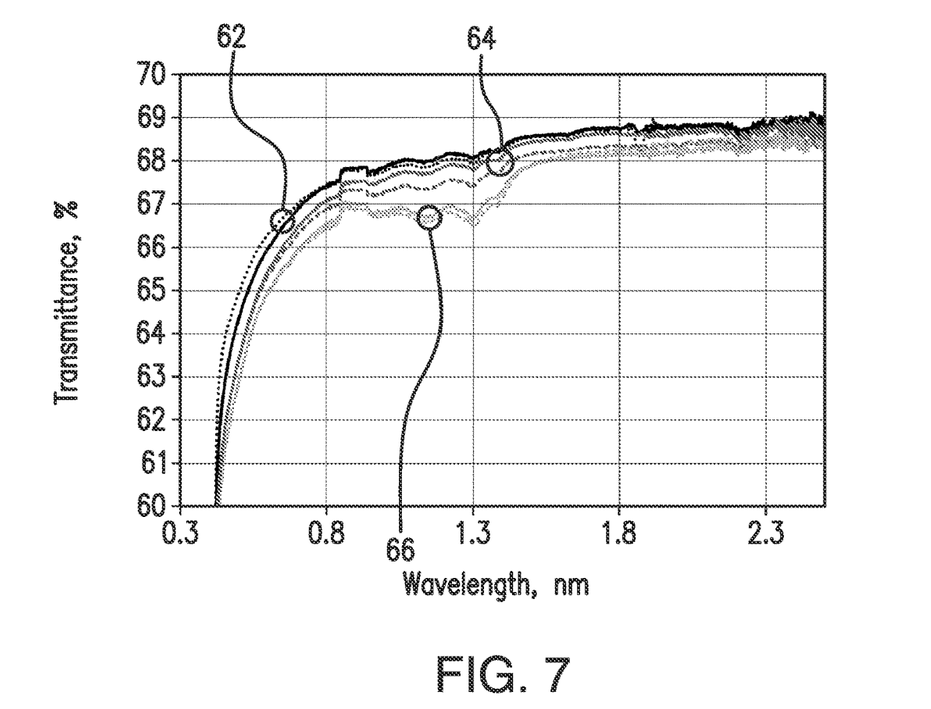
FIG. 7 is a graph of which shows transmission curves (transmittance as a function of wavelength) for six vanadium-compensated 6H—SiC wafers.

While all vanadium-compensated SiC crystals under this study were optically transmitting, they showed significant variations in their transmittance. An example of such variations is shown in FIG. 7 which illustrates optical transmission in the VIS-NIR range measured on six different vanadium-compensated 6H—SiC wafers. Two curves 66 of lowest transmittance were measured on two 6H wafers of Nu-type. (Nu-type refers to the type of compensated SiC crystal in which a shallow donor (nitrogen) dominates over shallow acceptors (Al+B).) The resistivity of the Nu-type wafers was in a range between $9 \cdot 10^9$ Ωcm and $2 \cdot 10^{11}$ Ωcm.

Two curves 62 of highest transmittance in FIG. 7, one solid and one dotted, signify two wafers of Pi-type. (Pi-type means the type of compensated SiC crystal in which a shallow acceptor (in this case Al) dominates over shallow donors (N).) The resistivity of these wafers was between $1 \cdot 10^6$ Ωcm and $1 \cdot 10^7$ Ωcm.

Two curves 64 in FIG. 7 show optical transmission of two 6H—SiC wafers of Pi-type containing boron (shallow acceptor) in concentrations exceeding those of N (shallow donor). The resistivity of these wafers was between $1 \cdot 10^{12}$ Ωcm and $1 \cdot 10^{14}$ Ωcm.

Figure 8:
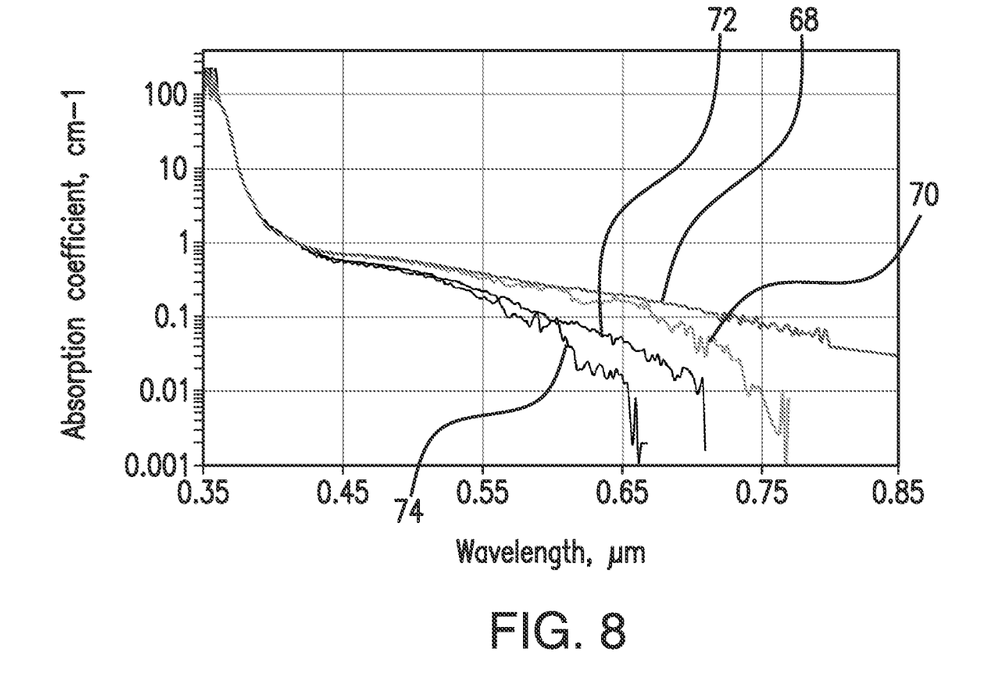
FIG. 8 is a graph of optical absorption (absorption coefficient as a function of wavelength) in the visible range for 4H—SiC wafers.
Figure 9:
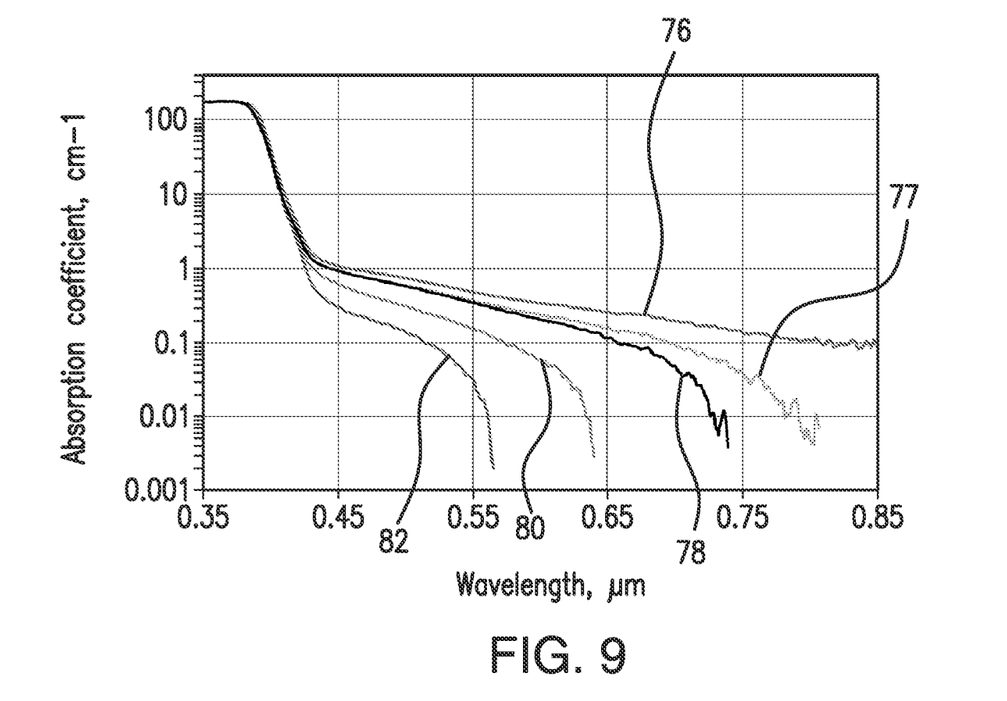
FIG. 9 is a graph of optical absorption (absorption coefficient as a function of wavelength) in the visible range for 6H—SiC wafers.

Optical absorption in the visible range calculated using equation (A5) for several 4H—SiC and 6H—SiC wafers having various doping and resistivity are shown in FIGS. 8 and 9.

The strongest absorption shown by lines 68 and 76 in FIGS. 8 and 9 is that of the Nu-type wafers with nitrogen dominating in the shallow impurity background. The 4H wafer had a resistivity of $1 \cdot 10^{11}$ Ωcm, while the 6H wafer had a resistivity of $1 \cdot 10^9$ Ωcm. For these wafers, optical absorption was the highest not just in the visible range, but in the infrared as well.

A somewhat lower optical absorption shown by lines 70 and 77 is also of the Nu-type wafers. However, these wafers had a higher resistivity of $5 \cdot 10^{12}$ Ωcm for 4H and $5 \cdot 10^{10}$ Ωcm for 6H.

Lines 72, 74, and 78 in FIGS. 8 and 9 represent optical absorption measured on Pi-type wafers with boron dominating in the shallow impurity background. The 4H wafers had a resistivity of $1 \cdot 10^{13}$ Ωcm (line 72) and $1 \cdot 10^{14}$ Ωcm (line 78). The 6H wafer had a resistivity of $1 \cdot 10^{11}$ Ωcm (line 78). The absorption in these wafers was limited to the band edge shoulder and did not extend into infrared.

The lowest optical absorption is shown by curves 80 and 82 in FIG. 9. It was measured on two 6H—SiC wafers of Pi-type with Al dominating in the shallow impurity background. The wafers had a relatively low resistivity of $1 \cdot 10^5$ Ωcm and $1 \cdot 10^7$ Ωcm.

Correlation between optical absorption of a vanadium-compensated SiC crystal, its type, doping, and resistivity is given in Table 1 below. The coefficient of optical absorption determined in the infrared at $\lambda = 2.5$ μm is added in the last column.

TABLE 1

| SiC Poly-type | Vanadium cm$^{-3}$ | Type | Dominating Shallow Impurity | Resistivity Ωcm | Coefficient of Optical Absorption, cm$^{-1}$ | | | |
|---|---|---|---|---|---|---|---|---|
| | | | | | @ 450 nm | @ 550 nm | @ 800 nm | @ 2.5 um |
| 6 H | $9 \cdot 10^{16}$ to $1.5 \cdot 10^{17}$ | Nu | Nitrogen | $<1 \cdot 10^9$ | ~1 | ~0.7 | ~0.1 | ~0.1 |
| | | Nu | Nitrogen | $5 \cdot 10^{10}$- $4 \cdot 10^{11}$ | ~1 | ~0.6 | <0.01 | <0.01 |
| | | Pi | Boron | $5 \cdot 10^{11}$- $1 \cdot 10^{13}$ | ~1 | ~0.5 | | |
| | | Pi | Aluminum | $1 \cdot 10^5$- $5 \cdot 10^6$ | ~0.7 | <0.2 | | |
| | | Pi | Aluminum | $5 \cdot 10^6$- $1 \cdot 10^8$ | ~0.3 | <0.04 | | |
| 4 H | $9 \cdot 10^{16}$ to $1.5 \cdot 10^{17}$ | Nu | Nitrogen | $<1 \cdot 10^{11}$ | ~0.8 | <0.5 | ~0.08 | ~0.05 |
| | | Nu | Nitrogen | $1 \cdot 10^{11}$- $1 \cdot 10^{12}$ | ~0.8 | <0.4 | <0.01 | <0.01 |
| | | Pi | Boron | $1 \cdot 10^{12}$- $1 \cdot 10^{14}$ | ~0.7 | <0.4 | | |

The obtained data may serve as guidance for selection of certain types of vanadium compensated, high resistivity, SiC single crystals for applications in transmission optics for the visible and near-infrared spectral ranges.

Vanadium-compensated, high-resistivity SiC single crystals of both 6H and 4H polytype are suitable for demanding applications in transmission optics in the wavelength range from 420 nm in the visible to about 4.5 μm in the infrared, especially if their doping and resistivity are optimized.

Due to the wider bandgap, vanadium-compensated 4H—SiC single crystals are preferred for optical applications at the shorter wavelengths of below 450 nm.

Vanadium-compensated SiC single crystals of Nu-type cannot be used for demanding optical applications if their resistivity is below $1 \cdot 10^{10}$ Ωcm for 6H and below $1 \cdot 10^{12}$ Ωcm for 4H. Such crystals will have optical losses approaching 1 cm$^{-1}$ in the visible range and up to 0.1 cm$^{-1}$ in the infrared.

Vanadium-compensated SiC single crystals of Nu-type can be used for optical applications in the infrared if their resistivity is above $1 \cdot 10^{11}$ Ωcm for 6H and above $5 \cdot 10^{12}$ Ωcm for 4H. For such crystals, the optical absorption will be below 0.01 cm$^{-1}$ in the infrared.

Vanadium-compensated SiC single crystals of Pi-type with boron dominating in the shallow impurity background can be used for optical applications in the infrared if their resistivity is above $1 \cdot 10^{11}$ Ωcm for 6H and above $1 \cdot 10^{13}$ Ωcm for 4H. For such crystals, the optical absorption will be below 0.01 cm$^{-1}$ in the infrared.

Vanadium-compensated SiC single crystals of Pi-type with boron dominating in the shallow impurity background may be used for optical applications in the visible range if their resistivity is above $1 \cdot 10^{13}$ Ωcm for 4H and above $5 \cdot 10^{11}$ Ωcm for 6H. For such crystals, the optical absorption should be below 0.8 cm$^{-1}$ at $\lambda = 450$ nm and below 0.01 cm$^{-1}$ at $\lambda = 750$ nm.

Vanadium-compensated 6H—SiC single crystals of Pi-type with aluminum dominating in the shallow impurity background can be used for demanding optical applications if their resistivity is between $1 \cdot 10^5$ and $1 \cdot 10^8$ Ωcm. Such crystals may offer the best transmittance in the visible range. Their optical absorption should be below 0.8 cm$^{-1}$ at $\lambda = 450$ nm and below 0.01 cm$^{-1}$ at $\lambda = 750$ nm. Their near band edge absorption shoulder is lower and narrower than in all other crystal types.

Further, large, industrial-size silicon carbide (SiC) single crystals may be grown from the vapor phase through a sublimation technique commonly called Physical Vapor Transport (PVT). In this technique, a silicon carbide source, which may be in the form of a silicon carbon powder or grain, may be provided in a high temperature region of a crucible. A silicon carbide seed, such as a single-crystal silicon carbide plate or wafer of a 4H or 6H polytype, may be positioned in a lower temperature region of the crucible. The crucible may be heated to sublime the silicon carbide source and fill the crucible with the gaseous products of sublimation. The resulting vapors migrate to the cooler silicon carbide seed and deposit on the seed to grow a silicon carbide crystal boule of a desired polytype, diameter and thickness.

During sublimation growth, the silicon carbide crystal may be exposed to various impurities present in the growth system, and such exposure may lead to the formation of an impurity background in the crystal. Background impurities found in silicon carbide crystals include boron and nitrogen which, in some cases, may be present at levels as high as $n \cdot 10^{16}$ cm$^{-3}$. In silicon carbide crystals grown through sublimation, graphite may be a source of boron and nitrogen background impurities.

Optical properties of sublimation-grown bulk silicon carbide single crystals have been studied, and the overall character of optical absorption of a pure, undoped or, stated alternatively, not doped deliberately, hexagonal silicon carbide crystal is illustrated in Singh et al., "Nonlinear optical properties of hexagonal silicon carbide," *Appl. Phys. Lett*, Vol. 19, 2 (1971) 53-56. This illustration suggests that the fundamental transparency region for silicon carbide crystals of this nature stretches from the band edge cut-off (about 380 nm for 4H and about 410 nm for 6H) to $\lambda \approx 4$ μm in the infrared, where it is terminated by the bands of multi-phonon absorption. A near-band-edge absorption shoulder has a magnitude of about 1 cm$^{-1}$ and is typical for undoped 4H—SiC and 6H—SiC crystals.

Optical properties of sublimation-grown 4H and 6H silicon carbide single crystals heavily doped with boron, nitrogen and aluminum to $10^{18}$ cm$^{-3}$ or higher have been studied as discussed by Scajev et al., "Application of a Time-Resolved Four-Wave Mixing Technique for the Determination of Thermal Properties of 4H—SiC Crystals," *J Phys. D. Appl. Phys.* 42(5):055413, February 2009 and Tarekegne et al., "Investigation of the Absorption Mechanisms of SiC for Lighting Applications," *6th International Workshop on Wideband Semiconductor Materials & Devices*, Fujian, China, 2018. Each of these impurities produces a specific near-band-edge absorption band in the visible range. The boron-related optical absorption band peaks at about 430-480 nm for 4H—SiC and at about 450-510 nm for 6H—SiC. The aluminum-related absorption shoulder is at about 410-420 nm and is very close to the band-edge cut-off. The nitrogen-related absorption band is at about 460-470 nm in 4H and at about 620-630 nm in 6H.

While these crystals have been observed to have some optical transparency, they have been found to have very limited optical applications due mostly to optical absorption which may be caused by residual impurities. One approach for minimizing near-band-edge absorption in sublimation-grown 4H and 6H polytype silicon carbide crystals is to reduce the presence of the unwanted background impurities. However, considering the high temperature of the PVT growth process and the use of graphite as a crucible material, reduction of boron and nitrogen background impurities in PVT grown silicon carbide single crystals to levels below $1 \cdot 10^{15}$ cm$^{-3}$ may be, at the very least, viewed as challenging if not even practical.

According to the present disclosure, silicon carbide crystals of a 4H or 6H polytype may have high optical transparency in the visible spectral range. Silicon carbide crystals exhibiting these or similar characteristics may be used in a variety of optical applications, such as, without limitation, optical windows, lenses and optical waveguides operational at wavelengths between about 410 nm and about 750 nm. The sublimation Physical Vapor Transport (PVT) technique may be used to grow optically transparent 4H and 6H silicon carbide crystals. In one form, silicon carbide single crystals are doped with aluminum and include residual boron and nitrogen impurities. In one aspect, the aluminum dopant is present at a concentration which exceeds the combined concentration of the residual nitrogen and boron impurities and is otherwise below a level which may lead to instability in crystal growth. While not intending to be bound by any particular theory, it is believed the aluminum dopant reduces the magnitude of near-band-edge optical absorption related to the presence of boron and nitrogen impurities. Similarly, maintaining the lowest possible concentrations of background boron and nitrogen impurities may also reduce optical absorption.

As indicated above, silicon carbide single crystals, including those of 4H and 6H polytypes, may be grown using sublimation techniques. In one aspect, these techniques may be designed to reduce or remove boron and nitrogen impurities in or from the growth system.

For example, the presence of background boron may be reduced through the use of halogen-purified graphite parts, including, but not limited to, the growth crucible. In one form, halogen purification of a graphite part may include heating the graphite part in a furnace chamber having an atmosphere containing chlorine, fluorine or both chlorine and fluorine. At high temperatures, carbon-bound boron residing in graphite reacts with the gaseous halogens such as chlorine and fluorine and forms volatile halides, such as $BCl_3$ and $BF_3$. A flow of inert gas through the furnace chamber may remove the volatile halides from the furnace chamber. Following this purification, the graphite part may still contain residual boron in concentrations between about 10 and about 100 weight ppb. Similarly, silicon carbide crystals grown by sublimation utilizing these purified graphite parts may still contain residual boron impurity at a concentration of about $10^{15}$-$10^{16}$ cm$^{-3}$.

Reduction or removal of nitrogen impurities in or from the growth system may include pre-growth high temperature baking of the crystal growth hot zone in vacuum. In addition, the sublimation crystal growth may be conducted under a flow of ultra-high-purity argon. Silicon carbide crystals grown under these conditions may still contain residual nitrogen impurity at a concentration of about $10^{15}$-$10^{16}$ cm$^{-3}$.

Given that some residual boron and nitrogen impurities may remain even taking steps for reducing or removing the same, near-band-edge optical absorption due to their presence may still exist. As indicated above, however, the addition of an aluminum dopant may be used to reduce the near-band-edge optical absorption caused by the presence of the boron and nitrogen impurities. Similar to boron, aluminum is a shallow acceptor in 4H—SiC and 6H—SiC. In the SiC gap, the energy level of aluminum is located at about 0.2 eV above the valence band maximum (see, e.g., Atabaev et al., "Spectral Dependence of Optical Absorption of 4H—SiC Doped with Boron and Aluminum," *J. Spectroscopy* (2018) Article ID 8705658 and in on-line NSM Archive—Silicon Carbide (SiC)—Impurities and Defects). The lowest energy level of a boron acceptor is at about 0.35 eV above the valance band edge, and above that of aluminum. As an acceptor, aluminum may join boron in compensation of nitrogen—a donor. If aluminum is introduced in a sufficient concentration such that $N_{Al}+N_B>N_N$, all electrons will be stripped from the nitrogen level and hence no electrons will be present at the bottom of the conduction band. Accordingly, the nitrogen-related optical absorption may be reduced or eliminated.

Doping with aluminum will cause redistribution of the electric charge in the silicon carbide crystal, which will be manifested by the shift of the Fermi level position closer to the aluminum level. If aluminum is introduced in a sufficient concentration such that $N_{Al}>N_B+N_N$, the Fermi level will move in a position below the lowest level of boron, thus reducing or eliminating the population of electrons residing on the boron level. Accordingly, the boron-related optical absorption may be reduced or eliminated.

With the above in mind, in order to "depopulate" both boron acceptors and nitrogen donors from electrons, the concentration of the aluminum dopant ($N_{Al}$) exceeds the combined concentration of the residual boron ($N_B$) and nitrogen ($N_N$) as exhibited by equation (1):

$$N_{Al}>N_B+N_N \tag{1}$$

Doping with aluminum may lead to aluminum related optical absorption, but any such absorption band will be very close to the band-edge cut-off and will practically merge with it.

In 4H and 6H silicon carbide polytypes doped with aluminum, aluminum will substitute for silicon. The covalent radius of aluminum is 1.43 Å while the covalent radius of silicon is 1.17 Å. Given that the radius of aluminum is larger, dissolution of aluminum in the silicon carbide crystal may cause local swelling of the lattice and stress. At certain concentrations of aluminum, formation of crystal defects, misoriented grains and foreign polytypes may occur during silicon carbide crystal growth. These issues may be avoided by maintaining the concentration of aluminum below a certain level, such as, about $5 \cdot 10^{17}$ cm$^{-3}$, although variations are possible.

While aluminum doped silicon carbide single crystals may be grown by adding aluminum carbide ($Al_4C_3$) directly to the silicon carbide solid source, $Al_4C_3$ is not stable at high temperatures and may undergo dissociation by a peritectic reaction into solid carbon and an Al+C liquid with the partial pressure of gaseous aluminum over the liquid exceeding 100 Torr. As a result, there may be an initial spike in aluminum concentration in the crystal followed by rapid depletion of the aluminum source.

Figure 10:
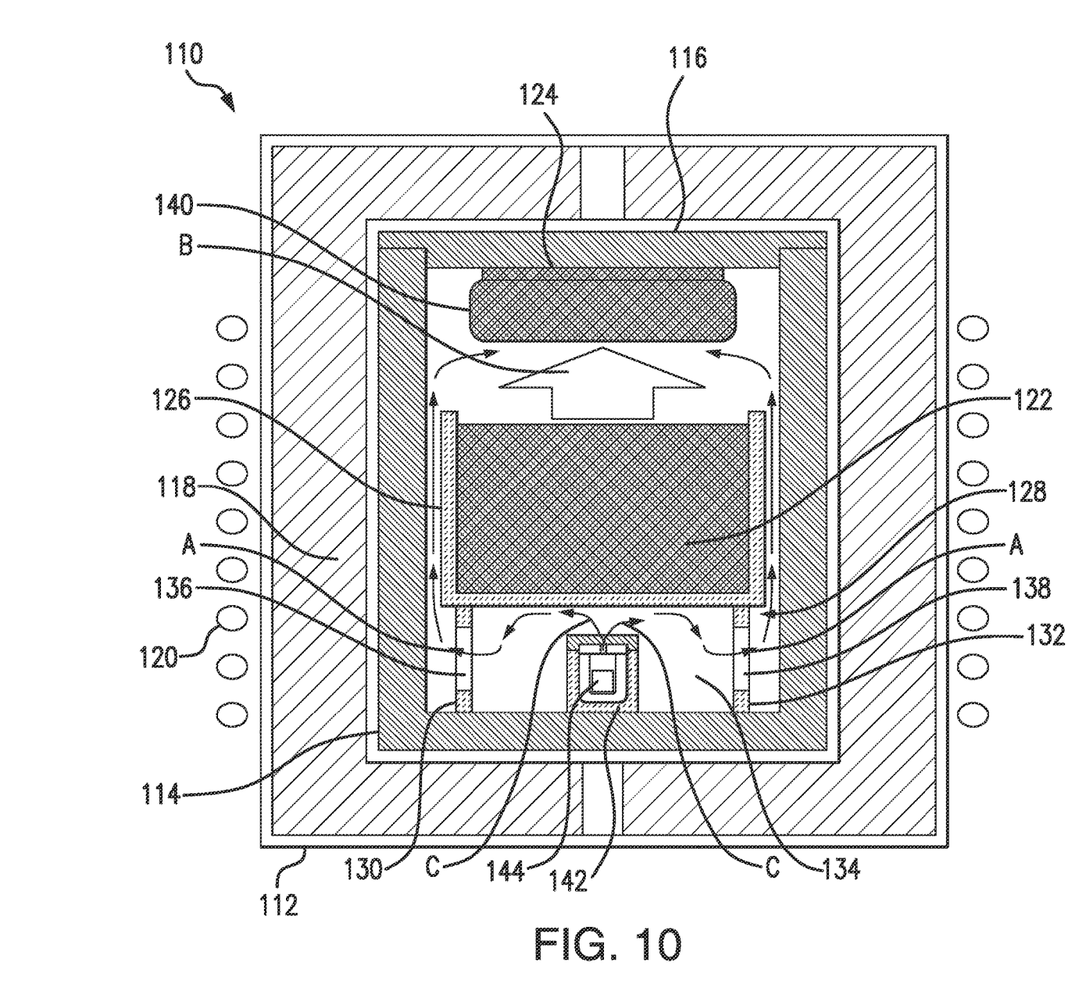
FIG. 10 is a schematic illustration of a system for sublimation growth of aluminum doped silicon carbide crystals.

U.S. Pat. No. 8,216,369, the contents of which are incorporated herein by reference in their entirety, relates to more spatially uniform doping in the PVT process. For example, it discloses a growth process which includes a doping time-release capsule loaded with a dopant and contained in the interior of the growth crucible. With reference to FIG. 10 of the subject application, there is schematically illustrated a system 110 for sublimation growth of aluminum doped silicon carbide crystals with a more spatially uniform aluminum concentration throughout the crystal. The system 110 includes a chamber 112 within which a growth crucible 114 is positioned.

The crucible 114 is sealed with a lid 116 and surrounded by thermal insulation 118. A heating element 120 is positioned around the chamber 112 and is configured to provide heat to the crucible 114. The heating element 120 may be an RF coil or a resistive heating element, although other variations are possible.

Within the crucible 114, a SiC source 122 and SiC seed 124 are disposed in a spatial relationship suitable for PVT crystal growth. More specifically, the SiC seed 124 may be positioned near the top of the crucible 114 and may, for example, be attached or coupled to the lid 116, and the SiC source 122 may be positioned below the SiC seed 124. The SiC source 122 is contained in a crucible 126 which is supported by a support structure 128. The support structure 128 includes a first member 130 spaced from a second member 132, and the first and second members 130, 132 extend from a lower portion of the crucible 114 toward the lid 116. In this arrangement, the crucible 126, and in turn the SiC source 122 positioned in the crucible 126, are positioned above the lower portion of the crucible 114 and a free space 134 is positioned therebetween. The first member 130 includes an aperture 136 and the second member 132 includes an aperture 138. The apertures 136, 138 provide fluid communication between the free space 134 and a space positioned between the crucible 126 and the crucible 114 as indicated by the directional arrows A of FIG. 10.

When the crucible 114 is heated by the heating element 120 during sublimation growth of a crystal, the SiC source 122 vaporizes and fills the interior of the crucible 114 with Si-bearing and C-bearing vapors which flow toward the SiC seed 124 as indicated by directional arrow B. The Si-bearing and C-bearing vapors may include volatile molecular species such as Si, $Si_2C$ and $SiC_2$. A vertical temperature gradient may be established across the crucible 114 with the temperature at the lower portion of crucible 114 being higher than the temperature at an upper portion of the crucible 114, such as near the lid 116. A vertical temperature gradient of this nature creates a driving force for vapor transport as indicated by directional arrow B. This vapor transport brings the vapor nutrients from the SiC source 122 to the SiC seed 124. Upon reaching the SiC seed 124, supersaturated vapors precipitate on the SiC seed 124 causing growth of a SiC single crystal 140 on the SiC seed 124.

A time release doping capsule 142, which may be used for aluminum doping, is positioned in the crucible 114 in the free space 134. The doping capsule 142 includes an interior space or chamber for receiving and holding a dopant source 144. In one form, the dopant source 144 is a source of an aluminum dopant and may be in the form of a solid aluminum compound which has a low dissociation pressure at the SiC sublimation growth temperature. In one form for example, the dissociation pressure may be below about 1 Torr, although other variations are possible. Non-limiting examples of solid aluminum compounds which may be used include aluminum compounds containing oxygen such as, without limitation, aluminum carbonate, aluminum silicate and aluminum oxide. In one particular but non-limiting form, the solid aluminum compound is aluminum oxide ($Al_2O_3$) which is also referred to as alumina. The aluminum oxide may be provided in the form of pre-melted alumina "crackle," such as pieces of pure, undoped sapphire. Generally speaking, the amount of the dopant source 144 included in the doping capsule 142 may be sufficient to support aluminum doping throughout the entire crystal growth cycle.

During the crystal growth cycle, the crucible 114 is heated and as the temperature of the crucible 114 increases up to about 2000° C., aluminum compounds containing oxygen undergo chemical transformations that ultimately yield solid aluminum oxide. As the temperature of the crucible 114 further increases and reaches and exceeds the melting point of aluminum oxide of about 2040° C., aluminum oxide melts and fills the interior of the doping capsule 142 with vapors which are products of the aluminum oxide melt volatilization and dissociation. The vapors may include molecules of $Al_2O_3$, $Al_2O$, AlO, Al and O. At the melting point of aluminum oxide, the total vapor pressure over the melt is on the order of about 0.01 Torr, while at 2200° C., it is less than 0.1 Torr. Similarly, the vapor pressure of molten aluminum oxide should not exceed about 1 Torr provided the temperature of the SiC sublimation growth process does not exceed about 2400° C.

The doping capsule 142 includes a capillary channel, further details of which will be discussed below in connection with FIG. 11, through which the aluminum and oxygen bearing vapors escape the doping capsule 142 and migrate within the crucible 114 as symbolized by directional arrows C in FIG. 10. In the process of migration, these vapors may come in contact with carbon of graphite and react with it to form elemental aluminum vapor and carbon monoxide gas. Eventually, aluminum vapor may reach the silicon carbide crystal growth interface and adsorb on the interface causing aluminum doping of the growing silicon carbide crystal.

The doping capsule 142 may be formed of one or more materials which provide stability in the high-temperature environment of silicon carbide sublimation growth, and against attack by molten alumina and highly corrosive silicon and carbon bearing vapors. With reference to FIG. 11, for example, in one non-limiting form, the doping capsule 142 is formed by an outer component 146 and an inner component 148 upon or around which the outer component 146 is formed or positioned. The outer component 146 may be at least partially formed of a first material and the inner component 148 may be at least partially formed of a second, different material.

Figure 11:
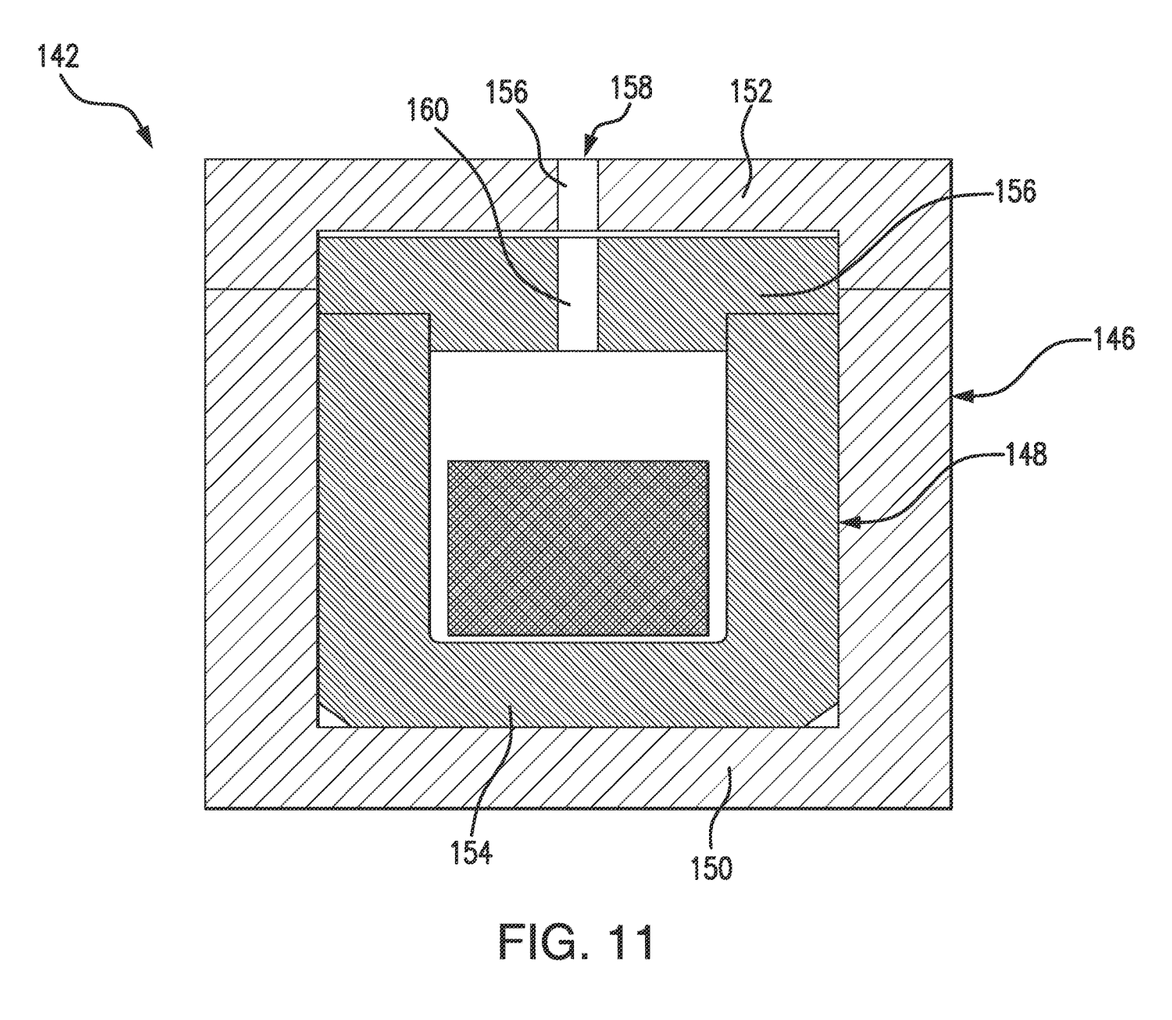
FIG. 11 is a schematic illustration of a doping capsule used in the system of FIG. 10.

In the form illustrated in FIG. 11, the outer component 146 is in the form of a crucible 150 which includes a lid 152. Since the crucible 150 and the lid 152 may be positioned in the free space 134, and in turn may be exposed to silicon and carbon bearing vapors released by the SiC source 122, the crucible 150 and the lid 152 thereof may be at least partially formed of a material that is stable against erosion by silicon and carbon bearing vapors which may be present in the crucible 114. For example, at least an external surface which may come into contact with the silicon and carbon bearing vapors may be formed of a material that is stable against erosion by silicon and carbon bearing vapors. Non-limiting examples of materials which may provide stability of this nature include graphite, carbides of refractory metals, such as tantalum carbide (TaC) or niobium carbide (NbC), and graphite coated with or layered by a refractory carbide. In one particular but non-limiting form, the crucible 150 and the lid 152 thereof may be formed of dense, fine-grain graphite.

In the form illustrated in FIG. 11, the inner component 148 is in the form of a crucible 154 which includes a lid 156. By way of example, the lid 152 of the crucible 150 may be removed to facilitate positioning of the crucible 154 and the lid 156 thereof in the crucible 150, and the lid 152 may be re-engaged with the crucible 150 to secure the crucible 154 and the lid 156 in the crucible 150. Since the crucible 154 and the lid 156 include an interior space or chamber for receiving and holding a dopant source 144 (which may be an aluminum dopant source for example), and in turn may be exposed to molten aluminum oxide, as well as to aluminum bearing vapors released by the dopant source 144, the crucible 154 and the lid 156 thereof may be at least partially formed of a material that is stable against erosion or degradation by molten aluminum oxide or aluminum bearing vapors. For example, at least an internal surface of the crucible 154 and the lid 156 which are disposed toward the dopant source 144 may be formed of a material that is stable or resistant against erosion or degradation by molten aluminum oxide or aluminum bearing vapors. Non-limiting examples of materials which may provide stability of this nature include refractory metal or metal alloys, such as, without limitation, tantalum, molybdenum, tungsten, rhenium or alloys thereof. In one particular but non-limiting form, the crucible 154 and the lid 156 thereof may be formed of tungsten.

While the doping capsule 142 has been described as being formed of separate inner and outer components formed of different materials, it should be appreciated that the doping capsule 142 may also be made from a single component having a composite structure formed from different materials. For example, the different materials may be present in separate layers where one layer of a first material is deposited on a second layer formed of a separate material. In the context of the crucible 154 and the lid 156, for example, these components could be formed a first material and then a second material could be coated or affixed to an exterior surface thereof to provide a structure similar to that illustrated in FIG. 11, although other variations are possible.

As mentioned above, the doping capsule 142 includes a capillary channel 158 through which aluminum and oxygen bearing vapors escape the doping capsule 142 as aluminum oxide is melted. The capillary channel 158 is formed by an aperture 160 through the lid 152 and an aperture 162 through the lid 156. The rate at which aluminum and oxygen bearing vapors may escape or be released from the doping capsule 142 may be at least partially controlled by the temperature at which the aluminum oxide is melted as well as the dimensions of the apertures 160, 162. For example, a higher rate of escape or release of the aluminum and oxygen bearing vapors from the doping capsule 142 may occur when the temperature at which the molten aluminum oxide is held is higher and the size of the apertures 160, 162 is larger. In some forms, the size of the apertures 160, 162 may be the same or different with one or both having a diameter in the range of about 0.1 to about 1.5 mm.

Use of the doping capsule 142 may, for example, facilitate production of sublimation-grown silicon carbide single crystals containing a spatially uniform concentration of aluminum dopant throughout the crystal. The above-described technique may also similarly avoid scenarios where a high aluminum concentration is present in the first-to-grow boule portions of the crystal followed by rapid depletion of the aluminum source. In addition, the aluminum dopant concentration may be controlled such that it exceeds the combined concentration of residual boron and nitrogen while remaining below a level (e.g., about $5·10^{17}$ cm$^{-3}$) that leads to the generation of crystal defects.

Example 1: Four aluminum doped SiC single crystals, two of a 4H polytype and two of a 6H polytype, were grown by sublimation. For the purpose of comparison, two additional SiC boules, one of a 4H polytype and one of a 6H polytype, were grown by sublimation but without aluminum doping. The experimental conditions of sublimation growth as disclosed below are provided with reference to the system 110 described above.

A doping capsule similar to doping capsule 142 of FIG. 11 was prepared. The doping capsule included an inner crucible and lid, corresponding or similar to the crucible 154 and the lid 156, made of pure tungsten available from Plansee USA LLC, 115 Constitution Boulevard, Franklin, MA 02038. The inner crucible had the following dimensions: 25 mm OD×15 mm ID×25 mm high. The lid was 5 mm thick and had a single through hole having a 1.0 mm diameter drilled in the center thereof. An outer crucible and lid, corresponding to the crucible 150 and the lid 152, were made of halogen-purified, dense, isostatic graphite grade IG-11 available from Toyo Tanso USA Inc., 2575 NW Graham Cir., Troutdale, OR 97060. The outer crucible had the following dimensions: 32 mm OD×25 mm ID×30 mm high. The graphite lid was 5 mm thick and had a 1.0 mm diameter hole drilled in the center thereof. The inner crucible fit tightly inside the outer graphite crucible.

Pieces of pure, pre-melted sapphire crackle weighing 7 grams in total were loaded into the inner crucible of the time-release capsule. A graphite growth crucible and lid, similar or corresponding to the crucible 114 and the lid 116, were made from halogen-purified, dense, isostatic graphite grade IG-11 available from Toyo Tanso USA Inc., 2575 NW Graham Cir., Troutdale, OR 97060. Prior to its use in crystal growth, the crucible and lid were halogen-purified to the ash level below 5 ppm by weight. The boron content in the purified graphite was determined to be 30 weight ppb via impurity analysis with a Glow Discharge Mass Spectrometer (EAG LLC, 4747 Executive Drive, Suite 700, San Diego, CA 92121).

The doping capsule was loaded at the bottom of the graphite growth crucible and a source crucible, corresponding or similar to the crucible 126, containing a SiC source was loaded into the graphite growth crucible. The source crucible was placed on a support such that a free space was formed to accommodate the doping capsule. A SiC seed was attached to the lid of the graphite growth crucible and the graphite growth crucible was sealed with the lid. The SiC seeds were 4H—SiC and 6H—SiC wafers 150 mm in diameter. The 4H—SiC seeds were oriented with their growth surface facing the <000-1> crystallographic direction. The 6H—SiC seeds were oriented with their growth surface facing the <0001> crystallographic direction.

The loaded graphite growth crucible was placed into a furnace chamber where it was surrounded by thermal insulation. The chamber was evacuated, and an RF coil was energized to heat the graphite growth crucible to an initial temperature of 1400° C. At this temperature and under continuous pumping, the growth system was soaked for 24 hours to achieve the deepest possible outgassing and to reach the residual pressure of $1·10^{-6}$ Torr. The chamber was filled with UHP argon containing less than 10 ppb of residual $N_2$ to a pressure of 5 torr, and a flow of UHP argon of 300 sccm was established across the chamber.

The graphite growth crucible was then heated to a sublimation growth temperature. More specifically, the graphite growth crucible was heated to achieve a temperature of 2180° C. at the top of the crucible and 2210° C. at the bottom of the crucible. The top and bottom temperatures were measured and monitored with an optical pyrometer. The graphite growth crucible was soaked at the above temperatures for a predetermined time period and then cooled to room temperature.

After finishing the growth run, the grown SiC crystal boule was recovered and fabricated into 150 mm diameter× 500-micron thick wafers in accordance with the SEMI standard. The wafers were polished, first mechanically and then using final CMP polishing.

Example 2: Optical properties of the wafers produced in Example 1 were evaluated. This evaluation included the measurements of their optical transmission and reflection. The measurements were carried out for non-polarized light using a spectrophotometer (Agilent Cary 7000 UMS) in the wavelength range from 350 nm to 850 nm. During the measurement of transmission, the angle of incidence (AOI) was 0°. During the measurement of reflection, the AOI was 6°. The coefficients of optical absorption ($\alpha$, cm$^{-1}$) were calculated from the data on transmission and reflection using an approximation of a plate with parallel surfaces, thickness d and infinite number of interior reflections as outlined in *Optical Processes in Semiconductors*, J. I. Pankove, Dover Publ, N Y, 1971, p. 93-94.

Figure 12:
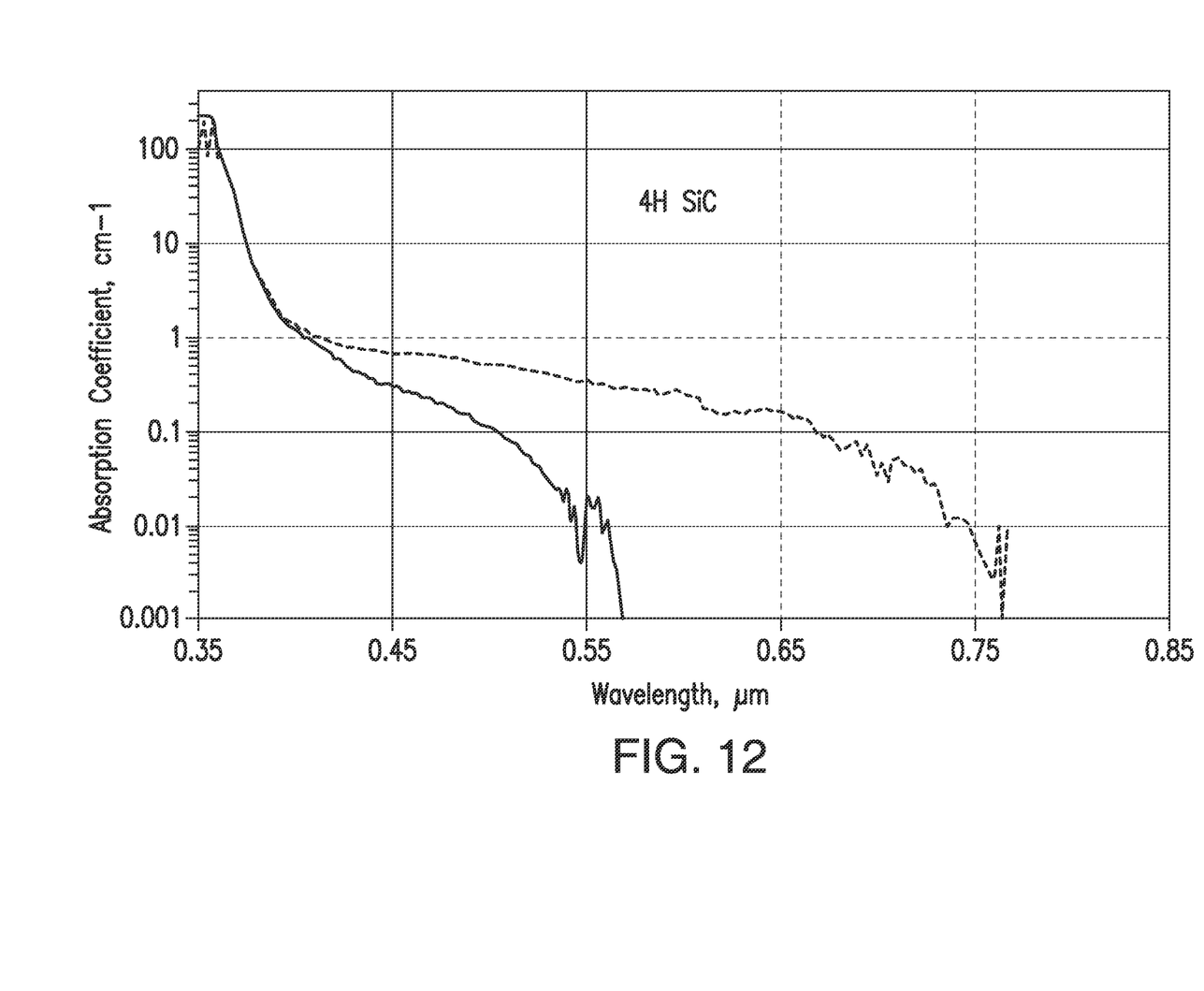
FIG. 12 is a graphical illustration of wavelength dispersions of the optical absorption ($\alpha$, $cm^{-1}$) measured on 4H—SiC wafers.
Figure 13:
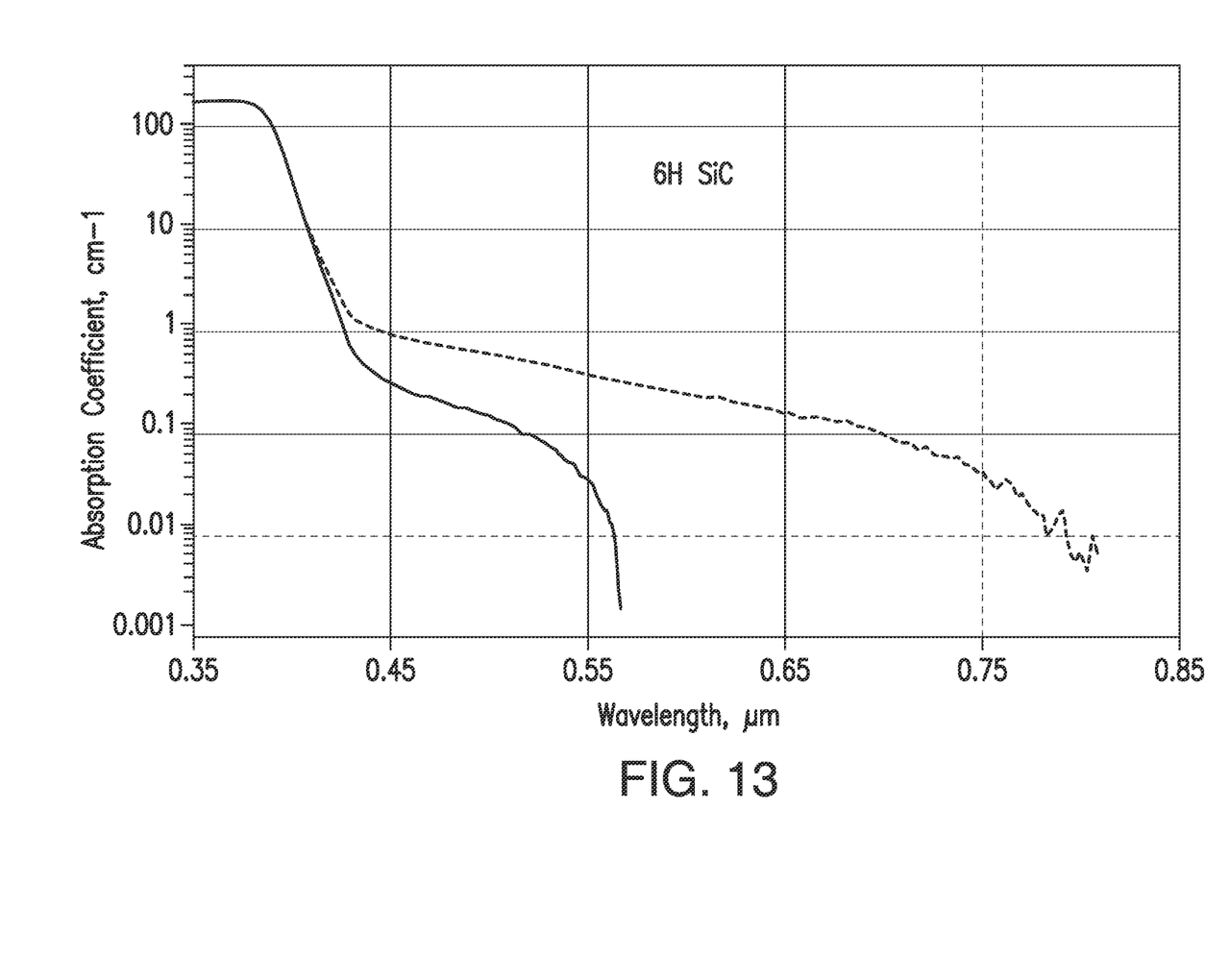
FIG. 13 is a graphical illustration of wavelength dispersions of the optical absorption ($\alpha$, $cm^{-1}$) measured on 6H—SiC wafers.

Wavelength dispersions of the optical absorption ($\alpha$, cm$^{-1}$) measured on some of the 4H—SiC wafers are shown in FIG. 12 and wavelength dispersions of the optical absorption ($\alpha$, cm$^{-1}$) measured on some of the 6H—SiC wafers are shown in FIG. 13. The plots in FIGS. 12 and 13 show absorption coefficients in wafers doped with aluminum (lower curves) and without aluminum doping (upper curves). Following optical measurements, some of the measured wafers were cleaved into smaller pieces, and the fragments were sent for N, B and Al impurity analysis by Secondary Ion Mass Spectroscopy (SIMS) (EAG LLC, 4747 Executive Drive, Suite 700, San Diego, CA 92121). The results of SIMS impurity analysis are shown in Table 2. The measures aimed at reduction of the background B and N contaminants that included the use of halogen purified graphite and extended vacuum bake of the hotzone resulted in the levels of B and N in the grown SiC crystals below $1·10^{16}$ cm$^{-3}$. The results of the measurements of the optical absorption coefficients are also shown in Table 2. The SiC crystals in the last two rows of Table 2 were grown without deliberate aluminum doping and are shown in the table for comparison. The obtained results show strong reduction of the optical transmission in the visible spectral range achieved by aluminum doping.

TABLE 2

| Polytype | Growth Direction | Wafer # | SIMS Analysis, cm$^{-3}$ | | | Optical Absorption, α (cm$^{-1}$) | | |
|---|---|---|---|---|---|---|---|---|
| | | | B | N | Al | λ = 450 nm | λ = 550 nm | λ = 650 nm |
| 6 H | <0001> | 02 | 6·10$^{15}$ | 8·10$^{15}$ | 2·10$^{17}$ | 0.2 | 0.02 | <0.01 |
| | | 05 | 7·10$^{15}$ | 4·10$^{15}$ | 6·10$^{16}$ | 0.25 | 0.025 | <0.01 |
| 6 H | <0001> | 02 | 5·10$^{15}$ | 8·10$^{15}$ | 3·10$^{17}$ | 0.3 | <0.01 | <0.01 |
| | | 07 | 6·10$^{15}$ | 4·10$^{15}$ | 9·10$^{16}$ | 0.22 | <0.01 | <0.01 |
| 4 H | <000-1> | 02 | 4·10$^{15}$ | 9·10$^{15}$ | 2·10$^{17}$ | 0.32 | 0.02 | <0.01 |
| | | 10 | 5·10$^{15}$ | 7·10$^{15}$ | 7·10$^{16}$ | 0.3 | 0.02 | <0.01 |
| 4 H | <000-1> | 02 | 8·10$^{15}$ | 9·10$^{15}$ | 1·10$^{17}$ | 0.31 | <0.01 | <0.01 |
| | | 06 | 7·10$^{15}$ | 5·10$^{15}$ | 5·10$^{16}$ | 0.24 | <0.01 | <0.01 |
| 6 H | <0001> | 02 | 5·10$^{15}$ | 9·10$^{15}$ | <5·10$^{13}$ | 1.2 | 0.4 | 0.2 |
| | | 12 | 4·10$^{15}$ | 4·10$^{15}$ | <5·10$^{13}$ | 0.95 | 0.3 | 0.15 |
| 4 H | <000-1> | 02 | 7·10$^{15}$ | 8·10$^{15}$ | <5·10$^{13}$ | 0.8 | 0.4 | 0.15 |

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A composition, comprising an aluminum doped silicon carbide crystal having impurities including residual nitrogen and residual boron, wherein the silicon carbide crystal includes aluminum at a concentration that is greater than a combined concentration of nitrogen and boron in the silicon carbide crystal, and wherein the silicon carbide crystal is for transmission of optical energy or information, wherein the optical energy or information comprises light having a wavelength in a range of from 420 nm to 4.5 μm, and the silicon carbide crystal includes an optical absorption coefficient of less than about 0.4 cm$^{-1}$ at a wavelength in a range between about 400 nm to about 800 nm, and wherein the concentration of nitrogen in the silicon carbide crystal is less than or equal to about 1·10$^{16}$ cm$^{-3}$.

2. The composition of claim 1, wherein the concentration of boron in the silicon carbide crystal is less than or equal to about 1·10$^{16}$ cm$^{-3}$.

3. The composition of claim 1, wherein the concentration of aluminum in the silicon carbide crystal is less than about 5·10$^{17}$ cm$^{-3}$.

4. The composition of claim 1, wherein the silicon carbide crystal is substantially free of aluminum induced defects.

5. The composition of claim 1, wherein the silicon carbide crystal is a 4H polytype or a 6H polytype.

6. The composition of claim 1, wherein the silicon carbide crystal exhibits an absorption coefficient below about 0.4 cm$^{-1}$ at a wavelength of about 450 nm.

7. The composition of claim 1, wherein the silicon carbide crystal exhibits an absorption coefficient below about 0.05 cm$^{-1}$ at a wavelength of about 550 nm.

8. The composition of claim 1, wherein the silicon carbide crystal exhibits an absorption coefficient below about 0.01 cm$^{-1}$ at a wavelength of 650 nm.

* * * * *